(12) United States Patent
Jeng et al.

(10) Patent No.: US 10,475,759 B2
(45) Date of Patent: Nov. 12, 2019

(54) INTEGRATED CIRCUIT STRUCTURE HAVING DIES WITH CONNECTORS OF DIFFERENT SIZES

(75) Inventors: Shin-Puu Jeng, Hsin-Chu (TW);
Chen-Hua Yu, Hsin-Chu (TW);
Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 528 days.

(21) Appl. No.: 13/270,776

(22) Filed: Oct. 11, 2011

(65) Prior Publication Data
US 2013/0087920 A1 Apr. 11, 2013

(51) Int. Cl.
*H01L 23/488* (2006.01)
*H01L 25/11* (2006.01)
(Continued)

(52) U.S. Cl.
CPC .......... *H01L 24/16* (2013.01); *H01L 23/3128* (2013.01); *H01L 23/498* (2013.01); *H01L 23/49827* (2013.01); *H01L 23/49838* (2013.01); *H01L 24/94* (2013.01); *H01L 24/97* (2013.01); *H01L 25/0652* (2013.01); *H01L 25/0655* (2013.01); *H01L 24/05* (2013.01); *H01L 24/13* (2013.01); *H01L 24/81* (2013.01); *H01L 2224/0401* (2013.01); *H01L 2224/05008* (2013.01); *H01L 2224/05022* (2013.01); *H01L 2224/05027* (2013.01); *H01L 2224/05124* (2013.01); *H01L 2224/05144* (2013.01); *H01L 2224/05147* (2013.01); *H01L 2224/05166* (2013.01); *H01L 2224/05572* (2013.01); *H01L 2224/05582* (2013.01); *H01L 2224/05647* (2013.01); *H01L 2224/05655* (2013.01); *H01L 2224/131* (2013.01); *H01L 2224/13025* (2013.01); *H01L 2224/13083* (2013.01); *H01L 2224/13111* (2013.01); *H01L 2224/13139* (2013.01); *H01L 2224/13147* (2013.01);
(Continued)

(58) Field of Classification Search
CPC . H01L 24/81; H01L 25/0652; H01L 25/0655; H01L 25/071; H01L 25/072; H01L 2225/1017; H01L 2225/1023; H01L 2225/1058; H01L 2224/1403; H01L 2224/1703; H01L 2224/14051; H01L 2224/17051; H01L 24/12–14; H01L 24/15–17
USPC .......................... 257/733, 735–738, 777–784
See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| TW | 200409337 A | 6/2004 |
| TW | 201130110 A | 9/2011 |

*Primary Examiner* — Julio J Maldonado
*Assistant Examiner* — Molly Reida
(74) *Attorney, Agent, or Firm* — Slater Matsil, LLP

(57) ABSTRACT

An embodiment is a structure comprising a substrate, a first die, and a second die. The substrate has a first surface. The first die is attached to the first surface of the substrate by first electrical connectors. The second die is attached to the first surface of the substrate by second electrical connectors. A size of one of the second electrical connectors is smaller than a size of one of the first electrical connectors.

20 Claims, 9 Drawing Sheets

(51) Int. Cl.
*H01L 23/00* (2006.01)
*H01L 23/31* (2006.01)
*H01L 23/498* (2006.01)
*H01L 25/065* (2006.01)

(52) U.S. Cl.
CPC ............ *H01L 2224/14181* (2013.01); *H01L 2224/16145* (2013.01); *H01L 2224/16148* (2013.01); *H01L 2224/16225* (2013.01); *H01L 2224/16238* (2013.01); *H01L 2224/16258* (2013.01); *H01L 2224/32145* (2013.01); *H01L 2224/32225* (2013.01); *H01L 2224/73204* (2013.01); *H01L 2224/81191* (2013.01); *H01L 2224/81193* (2013.01); *H01L 2224/81455* (2013.01); *H01L 2224/81815* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/00014* (2013.01); *H01L 2924/157* (2013.01); *H01L 2924/15311* (2013.01); *H01L 2924/181* (2013.01); *H01L 2924/18161* (2013.01)

(56) References Cited

U.S. PATENT DOCUMENTS

| | | |
|---|---|---|
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,777,816 B2 * | 8/2004 | Kazama et al. .............. 257/779 |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,569,935 B1 * | 8/2009 | Fan ................ H01L 24/16 257/737 |
| 7,576,435 B2 | 8/2009 | Chao |
| 7,834,450 B2 | 11/2010 | Kang |
| 8,535,961 B1 * | 9/2013 | Kuo ................ H01L 33/486 257/88 |
| 2003/0062620 A1 * | 4/2003 | Shibata .............. H01L 23/481 257/723 |
| 2004/0106230 A1 * | 6/2004 | Chan et al. .............. 438/107 |
| 2004/0108579 A1 | 6/2004 | Kazama et al. |
| 2005/0006752 A1 | 1/2005 | Ogawa |
| 2006/0264022 A1 * | 11/2006 | Sugimura ............ H01L 21/563 438/613 |
| 2008/0136003 A1 * | 6/2008 | Pendse ................ H01L 21/563 257/686 |
| 2009/0209062 A1 * | 8/2009 | Egawa .............. 438/108 |
| 2009/0230567 A1 * | 9/2009 | Kiong et al. ............ 257/783 |
| 2009/0289350 A1 * | 11/2009 | Watanabe .............. 257/701 |
| 2010/0246152 A1 * | 9/2010 | Lin .................. H01L 23/60 361/783 |
| 2011/0140283 A1 * | 6/2011 | Chandra ............ H01L 23/5385 257/777 |

* cited by examiner

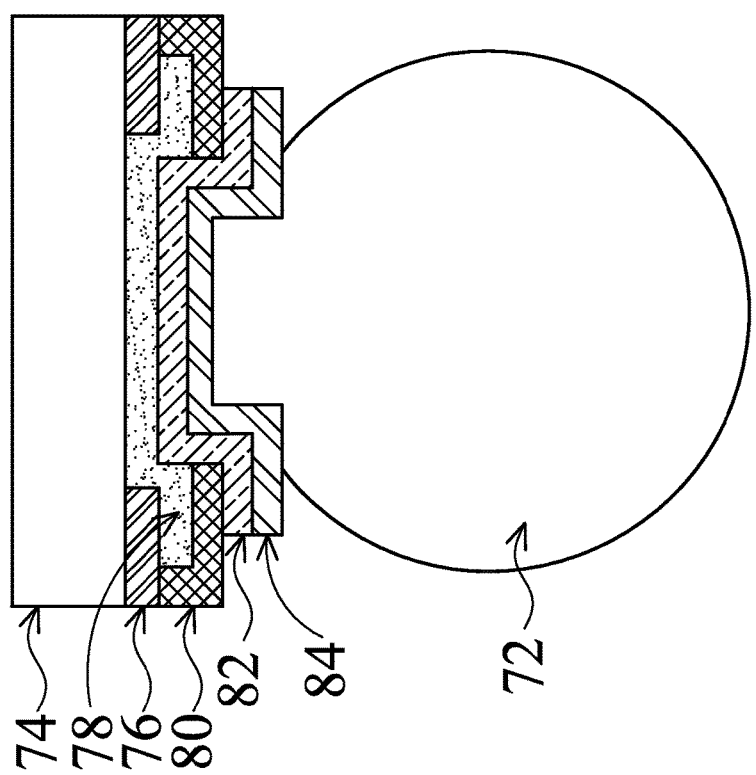

INTEGRATED CIRCUIT STRUCTURE HAVING DIES WITH CONNECTORS OF DIFFERENT SIZES

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. Various techniques have been developed to attempt to incorporate extra dimensionality into IC structures.

One technique is referred to as a two and a half dimensional (2.5D) structure. These structures typically have interposers having a die stacked on the interposer. Interposers have been used to redistribute ball contact areas from that of the chip to a larger area of the interposer. Further, interposers have allowed for a package that includes multiple chips.

Other techniques stack chips in a three dimensional (3D) structure. This allows for greater functionality with a reduced footprint of the structure.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 6 is a first connector for a 2.5DIC structure according to an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely two and a half dimensional integrated circuit (2.5DIC) structures. Other embodiments may also be applied, however, to three dimensional integrated circuit (3DIC) structures or other structures where different bonding precisions for bumps on dies can be used.

Figure 1:
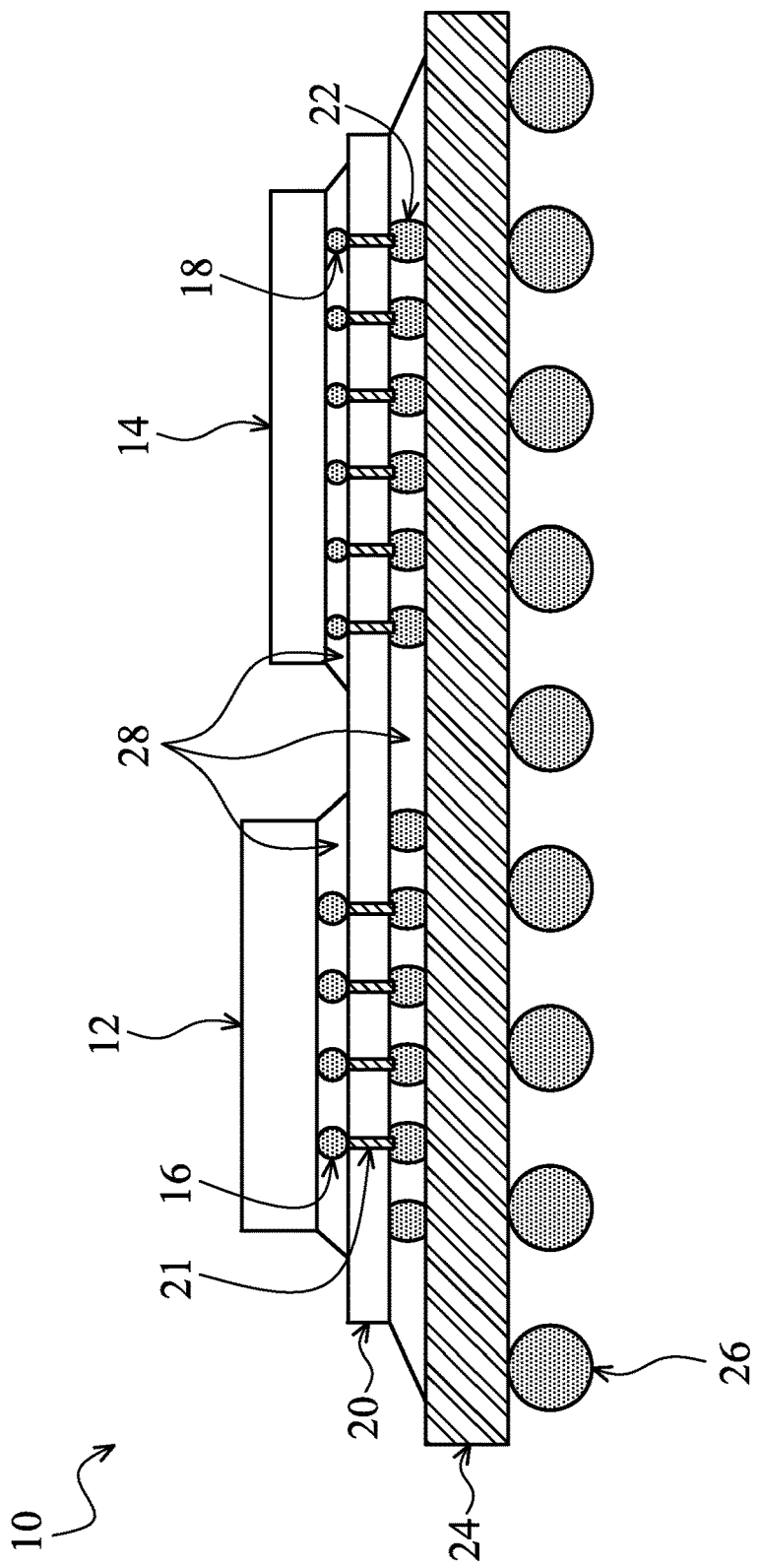
FIG. 1 is a two and a half dimensional integrated circuit (2.5DIC) or three dimensional integrated circuit (3DIC) structure according to an embodiment.

FIG. 1 illustrates a 2.5DIC or 3DIC structure 10 according to an embodiment. The structure 10 comprises a first die 12 and a second die 14 each attached to an interposer or integrated circuit die 20 having through substrate vias (TSVs) 21. The interposer or integrated circuit die 20 is attached to a substrate 24. The first die 12 is attached to a top surface of the interposer or integrated circuit die 20 by first connectors 16, such as minibumps or controlled collapse chip connection (C4) bumps, and the second die 14 is attached to the top surface of the interposer or integrated circuit die 20 by second connectors 18, such as microbumps. A bottom surface of the interposer or integrated circuit die 20 is attached to a top surface of the substrate 24 by third connectors 22, such as C4 bumps. A bottom surface of the substrate 24 has fourth connectors 26, such as ball grid array (BGA) balls, attached. An underfill material 28 is between the first die 12 and the interposer or integrated circuit die 20, between the second die 14 and the interposer or integrated circuit die 20, and between the interposer or integrated circuit die 20 and the substrate 24. For convenience, interposer or integrated circuit die 20 will be referenced as "interposer 20" in the following discussion for 2.5DIC embodiments. However, it should be noted that the interposer 20 may instead be an active die for a 3DIC structure.

In embodiments, the first die 12 may be a die having a low density of inputs and outputs, such as a dynamic random access memory (DRAM) die, a memory stack of dies, a radio frequency signal processing die, or the like. In embodiments, the second die 14 can have a high density of inputs or outputs, such as a graphics processing unit (GPU) die, a logic device die, or the like.

Figure 2:
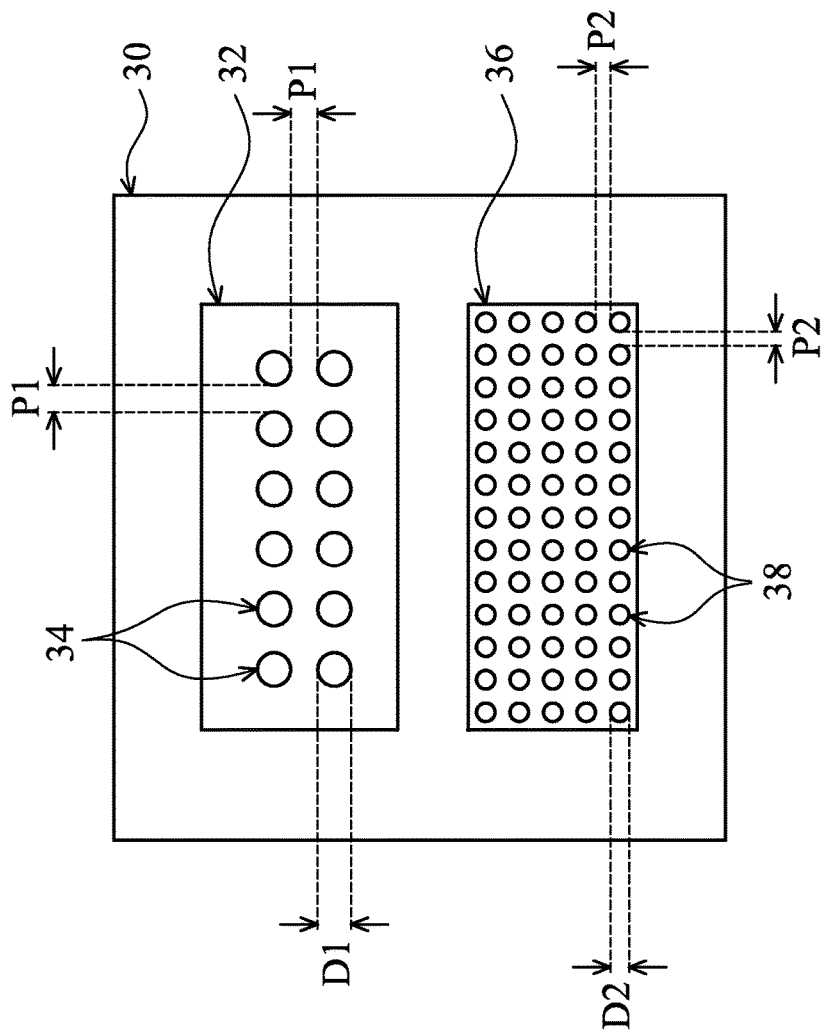
FIG. 2 is a layout view of an interposer of the 2.5DIC structure of FIG. 1 according to an embodiment.

In this embodiment, a size and pitch of the first connectors 16 is larger than a size and a pitch of the second connectors 18, respectively. FIG. 2 illustrates a layout 30 of the interposer 20 as an example of the size and pitch of the first connectors 16 and the second connectors 18. The layout 30 comprises a first die area 32 of the first die 12 and a second die area 36 of the second die 14. The first die area 32 has first connector areas 34 each having a diameter D1 and has pitches P1 between the first connector areas 34. Similarly, the second die area 36 has second connector areas 38 each having a diameter D2 and has pitches P2 between the second connector areas 38. As shown, the diameter D1 and the pitch P1 is larger than the diameter D2 and the pitch P2, respectively.

The following tables provide example approximate dimensions for the diameters and pitches illustrated in FIG. 2 for some embodiments. A person having ordinary skill in the art will readily realize that these dimensions may be modified for different technologies.

TABLE 1

| Diameter D1 | Diameter D2 |
| --- | --- |
| 35 μm-50 μm | 10 μm-20 μm |
| 35 μm-90 μm | 20 μm-30 μm |

TABLE 2

| Diameter D1 | Pitch P1 |
|---|---|
| 30 μm-45 μm | 60 μm |
| 50 μm-75 μm | 120 μm |
| 80 μm-110 μm | 160 μm |

TABLE 3

| Diameter D2 | Pitch P2 |
|---|---|
| 10 μm-13 μm | 20 μm |
| 15 μm-18 μm | 30 μm |
| 20 μm-26 μm | 40 μm |

Generally, the first connectors 16 can have a diameter D1 between 30 μm and 150 μm, and the second connectors 18 can have a diameter D2 between 10 μm and 30 μm. Further, the first connectors 16 can have a pitch P1 of greater than 50 μm, such as equal to or greater than 60 μm, and the second connectors 18 can have a pitch P2 of equal to or less than 50 μm.

Bonding of the first connectors 16 can have a larger accuracy window than the bonding of the second connectors 18. For example, the bonding tool that bonds the first connectors 16 can have an accuracy between approximately 7 μm and approximately 10 μm, and the bonding tool that bonds the second connectors 18 can have an accuracy of equal to or less than approximately 3 μm. By having a larger bonding accuracy, the cost of bonding the first connectors 16 may be between approximately 20 percent and approximately 30 percent of the cost of bonding the second connectors 18. Further, the throughput of bonders with these accuracies can be much greater for the first connectors 16 than for the second connectors 18, such as between 2,000 and 4,000 units per hour compared to between 500 and 700 units per hour.

Figure 3:
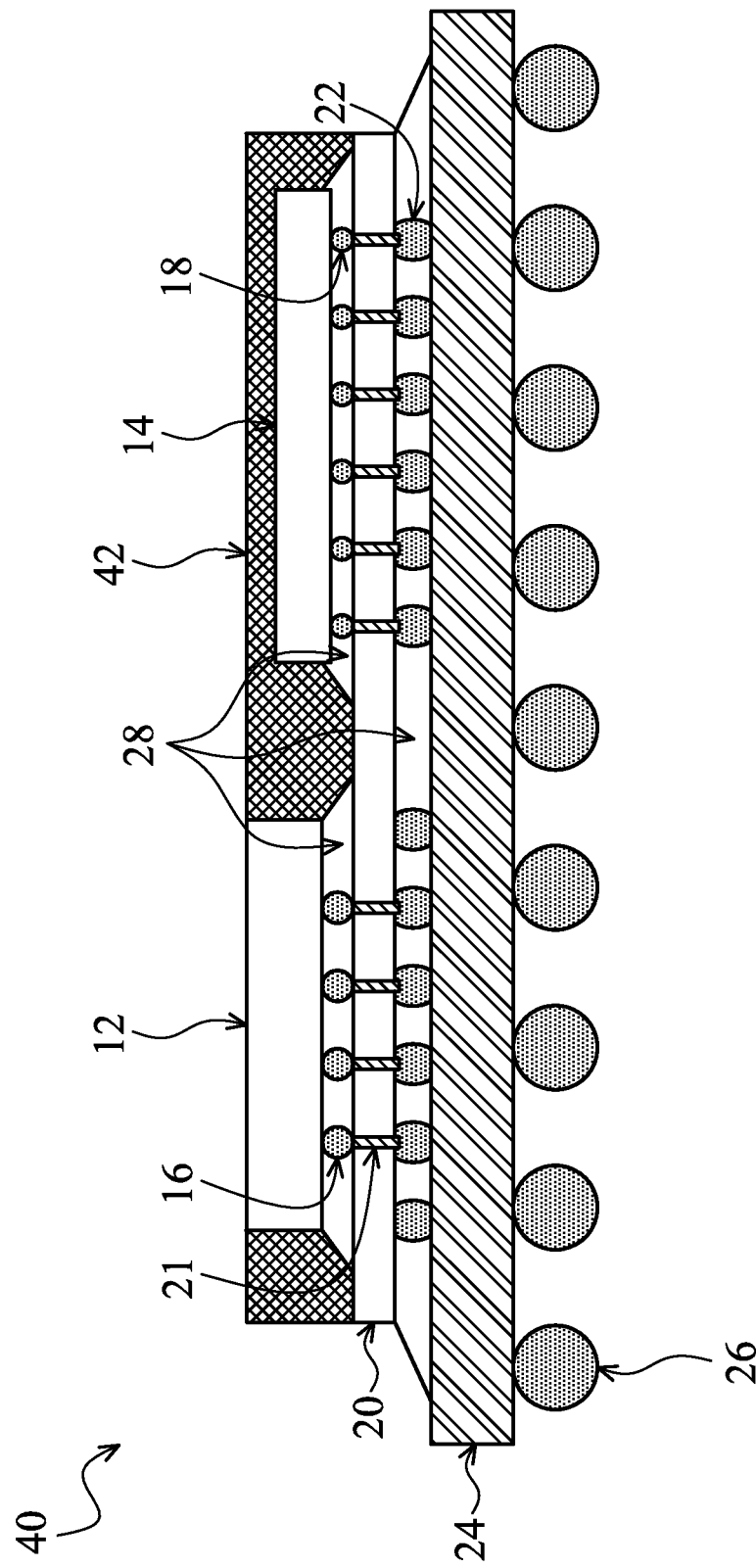
FIG. 3 is another 2.5DIC structure according to an embodiment.

FIG. 3 illustrates another 2.5DIC structure 40 according to an embodiment. The structure 40 comprises the components of the structure 10 in FIG. 1. Additionally, the structure 40 comprises a molding compound 42 encapsulating the first die 12 and the second die 14. In this embodiment, the height of the first die 12 from the interposer 20 is greater than the height of the second die 14. The molding compound 42, after being applied, such as by compression molding, and after being cured, is ground and/or polished, such as by a chemical mechanical polishing (CMP) process, to expose a surface of the first die 12. A surface of the second die 14 is not exposed because the height of the second die 14 is less than the first die 12. In other embodiments, a heat-dissipating material may be on a top surface of the second die 14, and the heat dissipating material may be exposed through the molding compound 42 along with the top surface of the first die 12.

Figure 4:
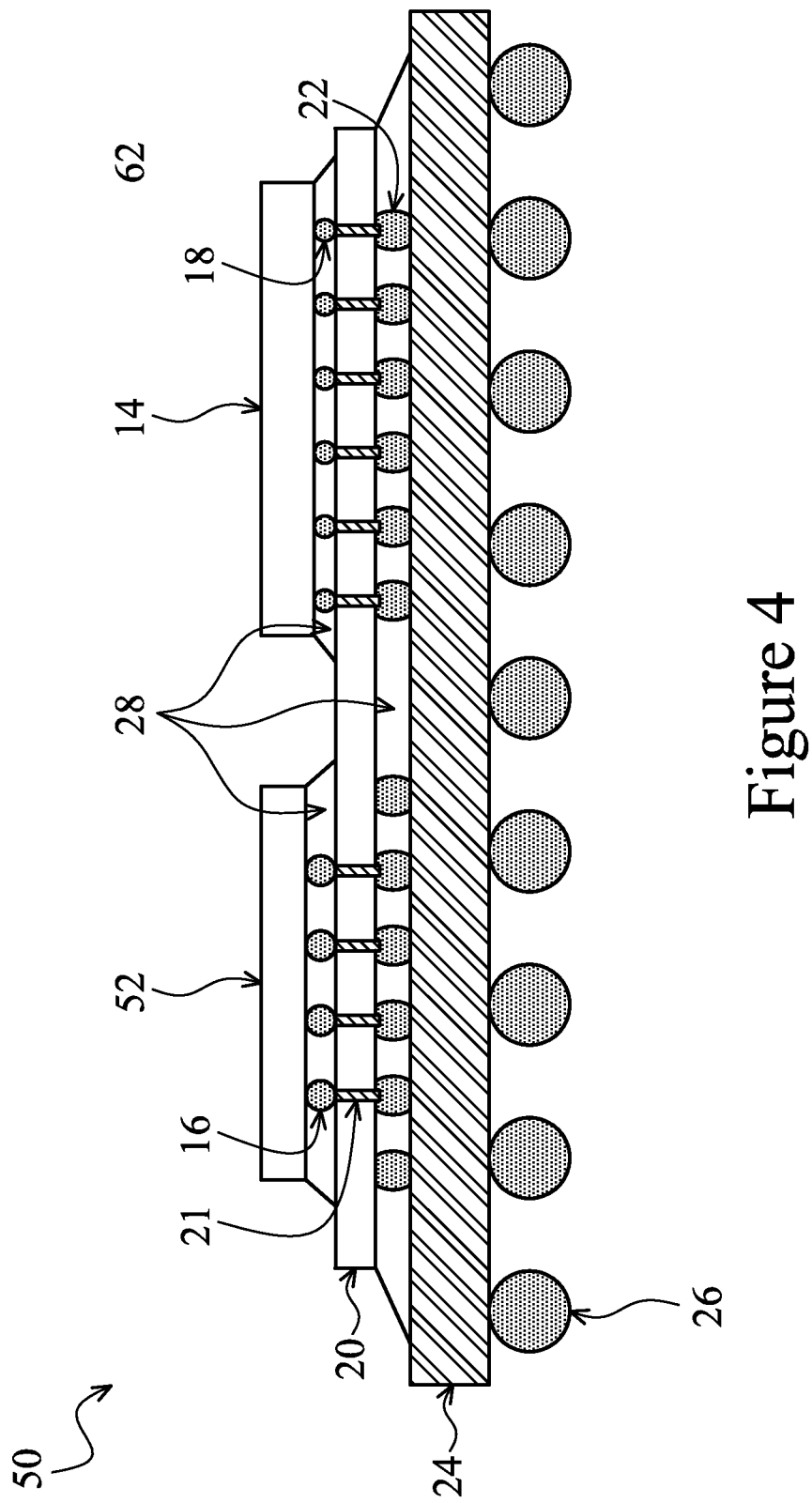
FIG. 4 is a further 2.5DIC structure according to an embodiment.
Figure 5:
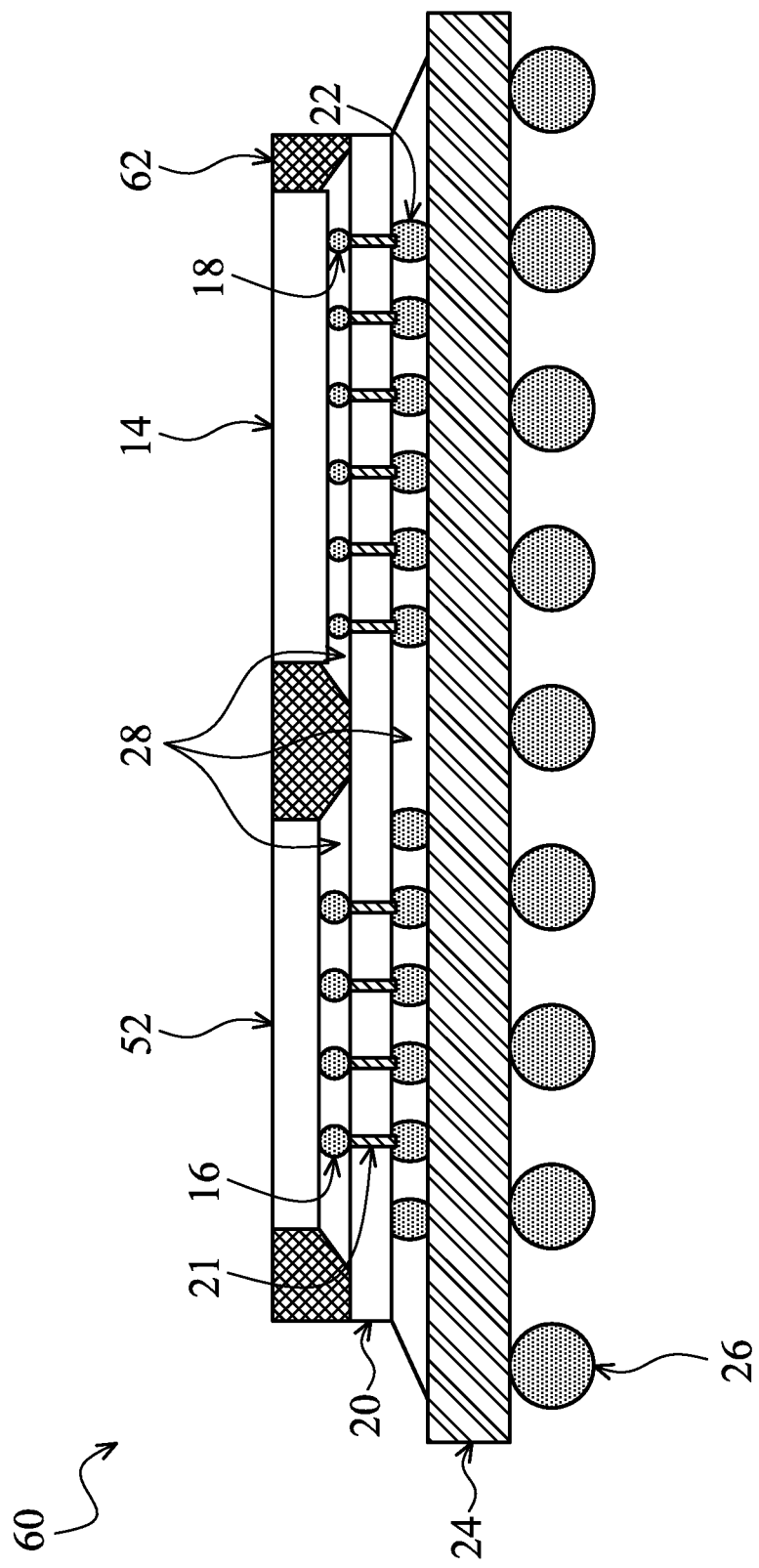
FIG. 5 is another 2.5DIC structure according to an embodiment.

FIG. 4 illustrates another 2.5DIC structure 50 according to an embodiment. The structure 50 is similar to the structure 10 in FIG. 1. The first die 12 in FIG. 1 is replaced with a thinner first die 52. The height of the thinner first die 52 with the first connections 16 measured from the interposer 20 is equal to the height of the second die 14 with the second connections 18 measured from the interposer 20. Thus, as shown in the embodiment of FIG. 5, when a molding compound 62 is applied to the structure 60, respective top surfaces of the thinner first die 52 and the second die 14 are exposed through the molding compound 62.

FIG. 6 illustrates the formation of one first connector 72 of the first connectors 16 on the first die 12 before bonding to the interposer 20. A substrate portion 74 of the first die 12 may be any combination of semiconductor substrate, dielectric layers, and/or metallization layers. A first passivation layer 76 covers the substrate portion 74. A post-passivation interconnect (PPI) 78 is formed through an opening in the first passivation layer 76. The PPI 78 may electrically couple a metallization component within the substrate portion 74. A second passivation layer 80 covers the first passivation layer 76 and a portion of the PPI 78. A first underbump metal (UBM) layer 82 is in an opening through the second passivation layer 80 to electrically couple the PPI 78. A second UBM layer 84 covers the first UBM layer 82. The first connector 72 is on the second UBM layer 84.

The first passivation layer 76 is formed over the substrate portion 74. The first passivation layer 76 may be a polymer such as polyimide, silicon oxide, silicon nitride, low-k dielectric, extremely low-k dielectric, the like, or a combination thereof. The first passivation layer 76 is formed using, for example, chemical vapor deposition (CVD), spin-on coating, or any suitable deposition technique. The opening through the first passivation layer 76 can be formed by using, for example, a suitable photolithographic mask and etching process.

The PPI 78 is formed to extend through the opening in the first passivation layer 76. The PPI 78 is formed by initially forming a seed layer (not shown), such as a titanium copper alloy, through a suitable formation process such as CVD or sputtering. A photoresist (not shown) may then be formed to cover the seed layer, and the photoresist may then be patterned to expose those portions of the seed layer that are located where the PPI 78 is desired to be located. Once the photoresist has been formed and patterned, a conductive material, such as copper, may be formed on the seed layer through a deposition process such as plating. Other suitable materials, such as AlCu or Au, and other suitable processes of formation, such as CVD or PVD, may be used to form the PPI 78.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 78 has been formed, the second passivation layer 80 is formed. The second passivation layer 80 may be formed from a polymer such as polyimide, or may be formed of silicon oxide, silicon nitride, low-k dielectric, extremely low-k dielectric, the like, or a combination thereof. An opening is made through the second passivation layer 80 by removing portions of the second passivation layer 80 to expose at least a portion of the underlying PPI 78. The opening is formed using, for example, a suitable photolithographic mask and etching process.

The first UBM layer 82 is formed in electrical contact with the PPI 78 and the second UBM layer 84 is formed over the first UBM layer 82. In this embodiment, the first UBM layer 82 is titanium, and the second UBM layer 84 is copper. Although shown with two layers, the UBM may comprise different numbers of layers, such as three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM. Any suitable materials or layers of material that may be used for the UBM are fully intended to be included within the scope of the current application.

The UBM may be created by forming each of the first UBM layer 82 and the second UBM layer 84 over the second passivation layer 80 and in the opening in the second passivation layer 80. Each layer may be formed using, for example, a plating process, such as electrochemical plating, although other processes of formation, such as sputtering, evaporation, or PECVD process, may be used. Once the layers have been formed, portions of the layers may then be removed through a suitable photolithographic masking and etching process to remove the undesired material and to leave the UBM in a desired shape, such as a circular, octagonal, square, or rectangular shape, although any desired shape may alternatively be formed.

The first connector 72 may be a contact bump and may comprise a material such as lead free solder, or other suitable materials, such as silver, tin, or copper. In an embodiment, the first connector 72 may be formed by forming a layer of tin through methods such as evaporation, electroplating, printing, solder transfer, ball placement, etc. Once a layer of tin has been formed on the structure, a reflow may be performed in order to shape the material into the desired shape.

Once the first connectors 16 are formed on the first die 12, such as discussed with respect to FIG. 6, the first die 12 is attached to the interposer 20, such as by attaching the first connectors 16 to pads on the interposer 20. The first connectors 16 are reflowed to form a permanent connection between the first die 12 and the interposer 20.

Figure 7A:
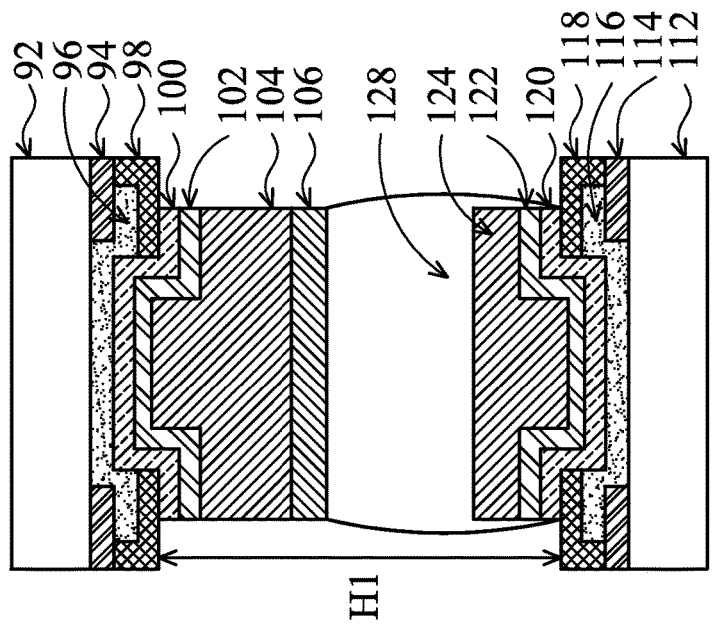
FIGS. 7A and 7B are a second connector for a 2.5DIC structure according to an embodiment.
Figure 7B:
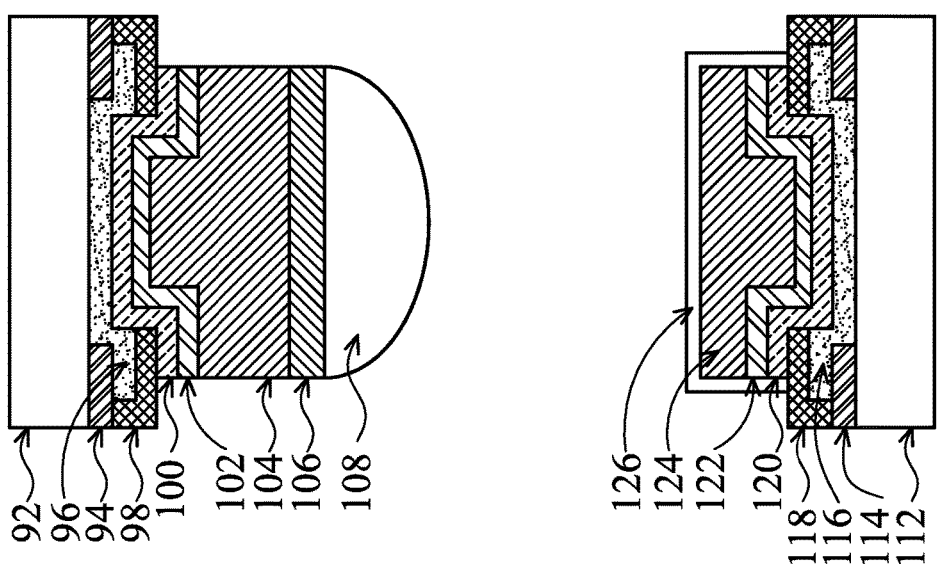

FIGS. 7A and 7B illustrate an example of the formation of a second connector 18. FIG. 7A shows a substrate portion 92 of the second die 14, a first passivation layer 94, a PPI 96, a second passivation layer 98, a first UBM layer 100, and a second UBM layer 102. FIG. 7A further shows a substrate portion 112 of the interposer 20, a first passivation layer 114, a PPI 116, a second passivation layer 118, a first UBM layer 120, and a second UBM layer 122. These components in FIG. 7A can be formed the same or similarly as discussed with regard to corresponding components in FIG. 6 with appropriate modifications for sizes and pitches.

After the formation of the conductive materials for the UBM and before the removal of undesired UBM materials, a seed layer is deposited on the second UBM layer 102, such as a copper or copper alloy formed by physical vapor deposition (PVD) or other deposition methods. A mask is formed over the seed layer and has an opening over the desired UBM pattern. The mask may be formed of a photo resist, for example, patterned using photolithography. Accordingly, a portion of the seed layer is exposed through an opening in the mask.

Next, a plating is performed to form metal pillar 104 on the second UBM layer 102 and in the opening of the mask. The plating may be an electro-plating, an electroless-plating, an immersion plating, or the like. In an embodiment, metal pillar 104 is a copper or copper alloy, and in other embodiments, the metal pillar 104 may be Sn—Ag, Sn—Ag—Cu, or the like, and may be lead-free or lead-containing.

In this embodiment, the metal pillar 104 is copper, and a top layer 106, such as a nickel, a tin layer, a palladium, a gold layer, alloys thereof, and multi-layers thereof, are formed on the surface of metal pillar 104. The mask is then removed, such as by an ash and/or flush process when the mask is a photoresist. The portion of the UBM, such as the first UBM layer 100 and the second UBM layer 102, previously covered by mask is also removed, for example, by an etch.

The solder material 108 can comprise a material such as lead free solder, or other suitable materials, such as silver, tin, or copper. In an embodiment, the solder material 108 may be formed by forming a layer of tin through methods such as evaporation, electroplating, printing, solder transfer, ball placement, etc. Once a layer of tin has been formed on the structure, a reflow may be performed in order to shape the material into the desired shape.

The metal pillar 124, the second UBM layer 122, and the first UBM layer 120 on the interposer is similarly formed as the corresponding components on the substrate portion 92 of the second die 14. The metal pillar 124 is formed to a lesser thickness than the metal pillar 104. After the metal pillar 124 is formed, the mask is then removed, such as by an ash and/or flush process when the mask is a photoresist. The portion of the UBM, such as the first UBM layer 120 and the second UBM layer 122, previously covered by mask is also removed, for example, by an etch.

Exposed portions of the first UBM layer 120, the second UBM layer 122, and the metal pillar 124 are covered by a cover layer 126. The cover layer 126 in this embodiment is electroless nickel, electroless palladium, immersion gold (ENEPIG). In other embodiments, the cover layer 126 is electroless nickel, electroless nickel and immersion gold (ENIG).

In FIG. 7B, the structures of FIG. 7A are brought together and the solder material 108 and the cover layer 126 are reflowed to form a reflowed portion 128. The metal pillar 104, top layer 106, reflowed portion 128, and metal pillar 124 form one of the second connectors 18. A height H1 between a surface of the interposer 20 and a surface of the second die 14 can be between approximately 20 µm and approximately 30 micrometers.

Figure 8B:
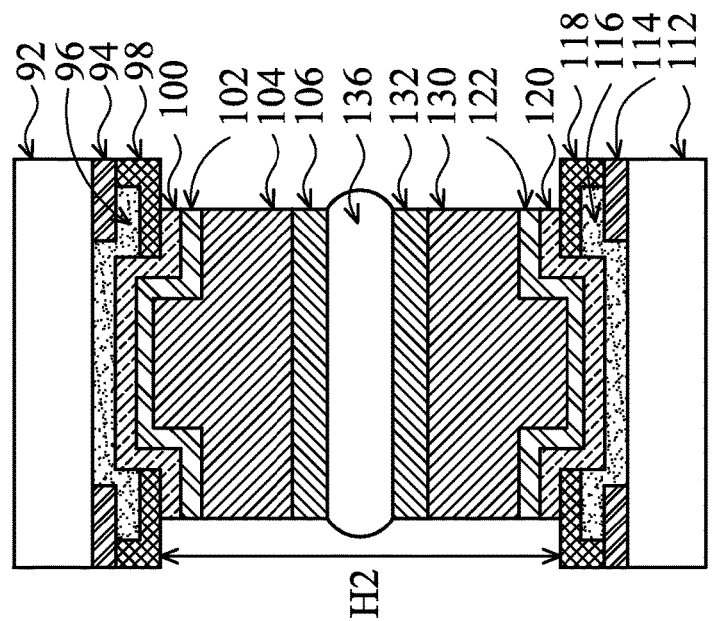
FIGS. 8A and 8B are another second connector for a 2.5DIC structure according to an embodiment.
Figure 8A:
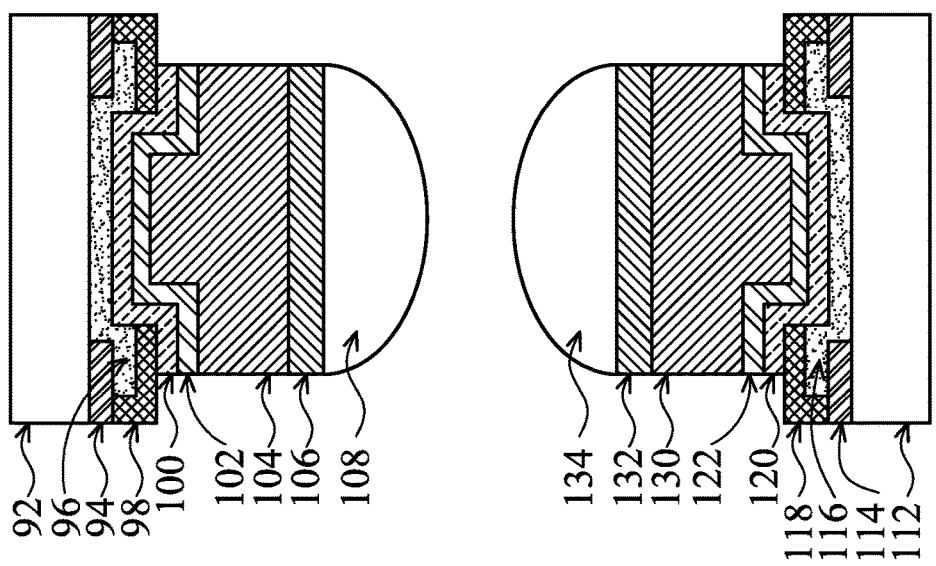

FIGS. 8A and 8B illustrate another example of the formation of a second connector 18. FIG. 8A shows a substrate portion 92 of the second die 14, a first passivation layer 94, a PPI 96, a second passivation layer 98, a first UBM layer 100, a second UBM layer 102, a metal pillar 104, a top layer 106, and a solder material 108. FIG. 8A further shows a substrate portion 112 of the interposer 20, a first passivation layer 114, a PPI 116, a second passivation layer 118, a first UBM layer 120, a second UBM layer 122, a metal pillar 130, a top layer 132, and a solder material 134. Corresponding components are formed in a same or similar manner as discussed with respect to FIG. 7A for components on the substrate portion 92 of the second die 14.

In FIG. 8B, the structures of FIG. 8A are brought together and the solder materials 108 and 134 are reflowed to form a reflowed portion 136. The metal pillar 104, top layer 106, reflowed portion 136, top layer 132, and metal pillar 130 form one of the second connectors 18. A height H2 between a surface of the interposer 20 and a surface of the second die 14 can be between approximately 30 µm and approximately 55 micrometers.

An embodiment is a structure comprising a substrate, a first die, and a second die. The substrate has a first surface. The first die is attached to the first surface of the substrate by first electrical connectors. The second die is attached to the first surface of the substrate by second electrical connectors. A size of one of the second electrical connectors is smaller than a size of one of the first electrical connectors.

Another embodiment is a structure comprising a substrate, a first die, and a second die. The substrate has a surface, and the surface comprises a first die-attach area and a second die-attach area. The first die is on the substrate in the first die-attach area, and the first die is electrically and mechanically coupled by first connectors to the substrate. The first connectors each have a first diameter along the first die-attach area and have a first pitch between respective adjacent ones of the first connectors along the first die-attach area. The second die is on the substrate in the second die-attach area, and the second die is electrically and mechanically coupled by second connectors to the substrate. The second connectors each have a second diameter along the second die-attach area and have a second pitch between respective adjacent ones of the second connectors along the second die-attach area. The first diameter is greater than the second diameter, and the first pitch is greater than the second pitch.

A further embodiment is a method for forming a structure. The method comprises attaching a first die to a surface of a substrate, the first die being attached by first electrical connectors, the first electrical connectors having a first size; and attaching a second die to the surface of the substrate, the second die being attached by second electrical connectors, the second electrical connectors having a second size, the first size being greater than the second size.

Figure 9:
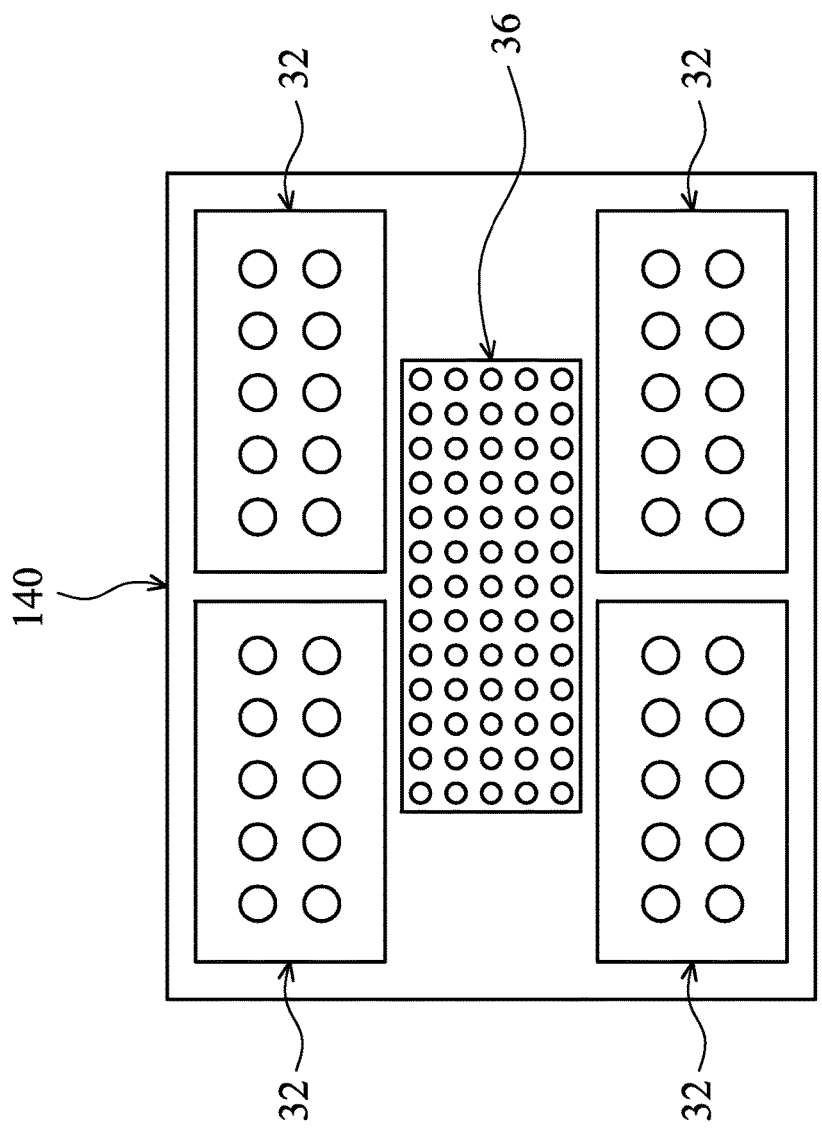
FIG. 9 is another layout view of an interposer of a 2.5DIC structure according to an embodiment.

Although the present embodiments and their advantages have been described in detail, it should be understood that various changes, substitutions and alterations can be made herein without departing from the spirit and scope of the disclosure as defined by the appended claims. For example, although the foregoing embodiments were discussed with respect to structures comprising two dies, embodiments can have any number of dies with any combination of connectors attaching those dies. FIG. 9 is an example to illustrate this. FIG. 9 shows an interposer layout 140 comprising four first die areas 32 and one second die area 36.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
    an integrated circuit die having a first surface;
    a first die attached to the first surface of the integrated circuit die by first electrical connectors; and
    a second die attached to the first surface of the integrated circuit die by second electrical connectors, wherein the second electrical connectors each comprises:
        a first under bump metal (UBM) structure at a lower surface of the second die facing the integrated circuit die;
        a first conductive pillar attached to the first UBM structure;
        a first conductive layer covering a lower surface of the first conductive pillar facing the integrated circuit die;
        a second UBM structure at the first surface of the integrated circuit die;
        a second conductive pillar attached to the second UBM structure; and
        a solder region between the first conductive layer and the second conductive pillar, the solder region extending continuously from a lower surface of the first conductive layer facing the integrated circuit die, along sidewalls of the second conductive pillar and sidewalls of the second UBM structure, to the first surface of the integrated circuit die, wherein sidewalls of the first conductive layer is free of the solder region.

2. The structure of claim 1, wherein respective adjacent ones of the first electrical connectors have a first pitch therebetween, and respective adjacent ones of the second electrical connectors have a second pitch therebetween, wherein the first pitch is greater than about 50 μm, and the second pitch is equal to or smaller than about 50 μm.

3. The structure of claim 1 further comprising a molding compound, the molding compound being around and between the first die and the second die.

4. The structure of claim 3, wherein a top surface of the first die is exposed from the molding compound, and the molding compound covers a top surface of the second die.

5. The structure of claim 3, wherein respective top surfaces of the first die and the second die are exposed from the molding compound.

6. The structure of claim 3 further comprising a substrate having an upper surface and a lower surface opposing the upper surface, wherein the upper surface is attached to a second surface of the integrated circuit die opposing the first surface through third electrical connectors, wherein the lower surface of the substrate has fourth electrical connectors attached thereto.

7. The structure of claim 6 further comprising an underfill material, wherein the underfill material fills a first gap between the first die and the integrated circuit die, a second gap between the second die and the integrated circuit die, and a third gap between the integrated circuit die and the substrate.

8. The structure of claim 1, wherein a top surface of the first die is a first distance from the first surface of the integrated circuit die, and a top surface of the second die is a second distance from the first surface of the integrated circuit die, the first distance being equal to the second distance.

9. The structure of claim 1, wherein a top surface of the first die is a first distance from the first surface of the integrated circuit die, and a top surface of the second die is a second distance from the first surface of the integrated circuit die, the first distance being greater than the second distance.

10. The structure of claim 1 further comprising:
    a first underfill disposed between the first surface of the integrated circuit die and the first die; and
    a second underfill disposed between the first surface of the integrated circuit die and the second die, wherein the first underfill and the second underfill are a same material.

11. A structure comprising:
    an interposer having a first surface, the first surface comprising a first die-attach area and a second die-attach area;
    a first die on the interposer in the first die-attach area, the first die being electrically and mechanically coupled by first connectors to the interposer, the first connectors each having a first diameter along the first die-attach area and having a first pitch between respective adjacent ones of the first connectors along the first die-attach area;
a first underfill disposed between the first die-attach area and the first die;
a second die on the interposer in the second die-attach area, the second die being electrically and mechanically coupled by second connectors to the interposer, the second connectors each having a second diameter along the second die-attach area and having a second pitch between respective adjacent ones of the second connectors along the second die-attach area, the first diameter being greater than the second diameter, and the first pitch being greater than the second pitch, wherein each of the second connectors comprises:
  a first under bump metal (UBM) structure on a lower side of the second die facing the interposer;
  a first metal pillar electrically and mechanically coupled to the first UBM structure;
  a first electrically conductive layer on a lower surface of the first metal pillar facing the interposer;
  a second UBM structure on the first surface of the interposer;
  a second metal pillar electrically and mechanically coupled to the second UBM structure;
  a solder material between and electrically coupling the first electrically conductive layer and the second metal pillar, wherein sidewalls of the first electrically conductive layer and sidewalls of the first metal pillar are free of the solder material;
a second underfill disposed between the second die-attach area and the second die, wherein a thickness of the first underfill and second underfill is thinner between the first and second die-attach areas than under their respective dies;
a substrate electrically and mechanically coupled by third connectors to the interposer, wherein the interposer is between the substrate and the first die; and
a third underfill disposed between the interposer and the substrate, wherein the first underfill, the second underfill and the third underfill are a same material.

12. The structure of claim 11, wherein a top surface of the first die distal the interposer extends further away from the interposer than a top surface of the second die distal the interposer.

13. The structure of claim 12 further comprising a molding compound, the molding compound being around and between the first die and the second die.

14. The structure of claim 13, wherein the structure further comprises a heat-dissipating material over the top surface of the second die, wherein the molding compound exposes the top surface of the second die and the heat-dissipating material.

15. The structure of claim 11, wherein a top surface of the first die and a top surface of the second die are co-planar.

16. The structure of claim 11, wherein the solder material extends continuously along sidewalls of the second metal pillar from an upper surface of the second metal pillar facing the second die to the first surface of the interposer.

17. The structure of claim 11, wherein each of the second connectors further comprises a second electrically conductive layer on an upper surface of the second metal pillar facing the second die, wherein the solder material extends continuously from the first electrically conductive layer to the second electrically conductive layer, and wherein sidewalls of the first electrically conductive layer and sidewalls of the second electrically conductive layer are free of the solder material.

18. A method for forming a structure, the method comprising:
  attaching a first die to a first surface of a substrate, the first die being attached by first electrical connectors, each of the first electrical connectors comprising a solder bump extending from a first under bump metal (UBM) structure of the first die to a first conductive feature on the first surface of the substrate, the substrate having a plurality of connectors attached to a second surface of the substrate opposing the first surface; and
  attaching a second die to the first surface of the substrate, the second die being attached by second electrical connectors, each of the second electrical connectors comprising a first metal pillar, a second conductive feature on the first surface of the substrate, and a solder material between the first metal pillar and the second conductive feature, the first metal pillar being attached to a second UBM structure of the second die and having straight sidewalls extending from the second UBM structure to a top surface of the first metal pillar distal the second die,
  wherein the second conductive feature is a second metal pillar attached to a third UBM structure of the substrate, wherein each of the second electrical connectors further comprises a conductive layer between the first metal pillar and the solder material, wherein the solder material fills a space between the conductive layer and the second metal pillar, wherein the solder material extends continuously along sidewalls of the second metal pillar and along sidewalls of the third UBM structure from an upper surface of the second metal pillar facing the second die to the first surface of the substrate, and wherein there is no solder material on sidewalls of the conductive layer or sidewalls of the first metal pillar.

19. The method of claim 18, wherein the first electrical connectors have a first size, the second electrical connectors have a second size, the first size being greater than the second size, and wherein each of the first size and the second size is a diameter of a cross section of a respective electrical connector, the cross section being parallel to the first surface of the substrate.

20. The method of claim 19, wherein the first size is between about 30 µm and about 150 µm, and the second size is between about 10 µm and about 30 µm.

* * * * *